United States Patent
Clark

(10) Patent No.: US 10,871,940 B2
(45) Date of Patent: Dec. 22, 2020

(54) SYSTEMS AND METHODS FOR SOUND ENHANCEMENT IN AUDIO SYSTEMS

(71) Applicant: Mimi Hearing Technologies GmbH, Berlin (DE)

(72) Inventor: Nicholas R. Clark, Royston (GB)

(73) Assignee: Mimi Hearing Technologies GmbH, Berlin (DE)

( * ) Notice: Subject to any disclaimer, the term of this patent is extended or adjusted under 35 U.S.C. 154(b) by 0 days.

(21) Appl. No.: 16/534,742

(22) Filed: Aug. 7, 2019

(65) Prior Publication Data
US 2020/0065058 A1 Feb. 27, 2020

Related U.S. Application Data

(60) Provisional application No. 62/721,417, filed on Aug. 22, 2018.

(30) Foreign Application Priority Data

Mar. 19, 2019 (EP) ..................................... 19163624

(51) Int. Cl.
*G06F 3/16* (2006.01)
*G10L 17/00* (2013.01)
(Continued)

(52) U.S. Cl.
CPC ......... *G06F 3/165* (2013.01); *G06K 9/00221* (2013.01); *G10L 17/00* (2013.01);
(Continued)

(58) Field of Classification Search
None
See application file for complete search history.

(56) References Cited

U.S. PATENT DOCUMENTS 6,327,366 B1 12/2001 Uvacek et al.
10,455,335 B1 10/2019 Clark
(Continued)

FOREIGN PATENT DOCUMENTS

WO 2009055281 A2 4/2009
WO 2011069504 A1 6/2011
WO 2018/069900 A1 4/2018

OTHER PUBLICATIONS

Plack, Christopher J., et al.; "Estimates of compression at low and high frequencies using masking additivity in normal and impaired ears"; The Journal of the Acoustical Society of America; Jan. 1, 2008; pp. 4321-4330.
(Continued)

*Primary Examiner* — Qin Zhu
(74) *Attorney, Agent, or Firm* — Polsinelli PC

(57) ABSTRACT

Disclosed are systems and methods for audio processing and sound personalization signal processing. Information suitable to derive an indication of a user's hearing ability is received, and a representative indication of hearing ability is determined for the user. A set of audio processing parameters are determined for the representative indication of hearing ability and a sound personalization signal processing algorithm is configured based on the set of audio processing parameters. An audio signal is received on an entertainment system and is processed using the configured sound personalization signal processing algorithm. The processed audio signal is then outputted from the entertainment system.

18 Claims, 14 Drawing Sheets

(51) Int. Cl.
   *G06K 9/00* (2006.01)
   *H04R 3/04* (2006.01)
   *H04R 1/10* (2006.01)
   *G10L 21/02* (2013.01)
   *H03G 5/16* (2006.01)

(52) U.S. Cl.
   CPC ............ *H04R 1/1041* (2013.01); *H04R 3/04* (2013.01); *G06K 9/00288* (2013.01); *H04R 2430/01* (2013.01); *H04R 2430/03* (2013.01)

(56) References Cited

U.S. PATENT DOCUMENTS

| | | | |
|---|---|---|---|
| 10,687,155 | B1 | 6/2020 | Clark et al. |
| 2003/0064746 | A1 | 4/2003 | Rader et al. |
| 2008/0165980 | A1 | 7/2008 | Pavlovic et al. |
| 2008/0182000 | A1 | 7/2008 | Groff et al. |
| 2008/0212799 | A1* | 9/2008 | Breitschadel ........ H03G 7/002 381/106 |
| 2009/0083043 | A1 | 3/2009 | Philippe et al. |
| 2011/0026724 | A1 | 2/2011 | Doclo |
| 2011/0035212 | A1 | 2/2011 | Briand et al. |
| 2012/0023051 | A1 | 1/2012 | Pishehvar et al. |
| 2012/0183165 | A1 | 7/2012 | Foo et al. |
| 2014/0254828 | A1 | 9/2014 | Ray et al. |
| 2014/0309549 | A1* | 10/2014 | Selig ................... H04R 1/1041 600/559 |
| 2014/0314261 | A1* | 10/2014 | Selig ................... H04R 25/50 381/314 |
| 2015/0078575 | A1* | 3/2015 | Selig ................... H04R 1/1091 381/74 |
| 2015/0281853 | A1* | 10/2015 | Eisner ................. H04R 25/505 381/312 |
| 2017/0308909 | A1* | 10/2017 | Faith ................. G06K 9/00288 |
| 2019/0004767 | A1* | 1/2019 | Aronson ............. G06F 3/04847 |
| 2019/0347062 | A1* | 11/2019 | Lyon ...................... G06F 3/165 |
| 2020/0029158 | A1 | 1/2020 | Clark |
| 2020/0029159 | A1 | 1/2020 | Clark |

OTHER PUBLICATIONS

Plack, Christopher et al. "Estimates of compression at low and high frequencies using masking additivity in normal and impaired ears"; The Journal of the Acoustical Society of America; Jul. 2008; pp. 11.

* cited by examiner

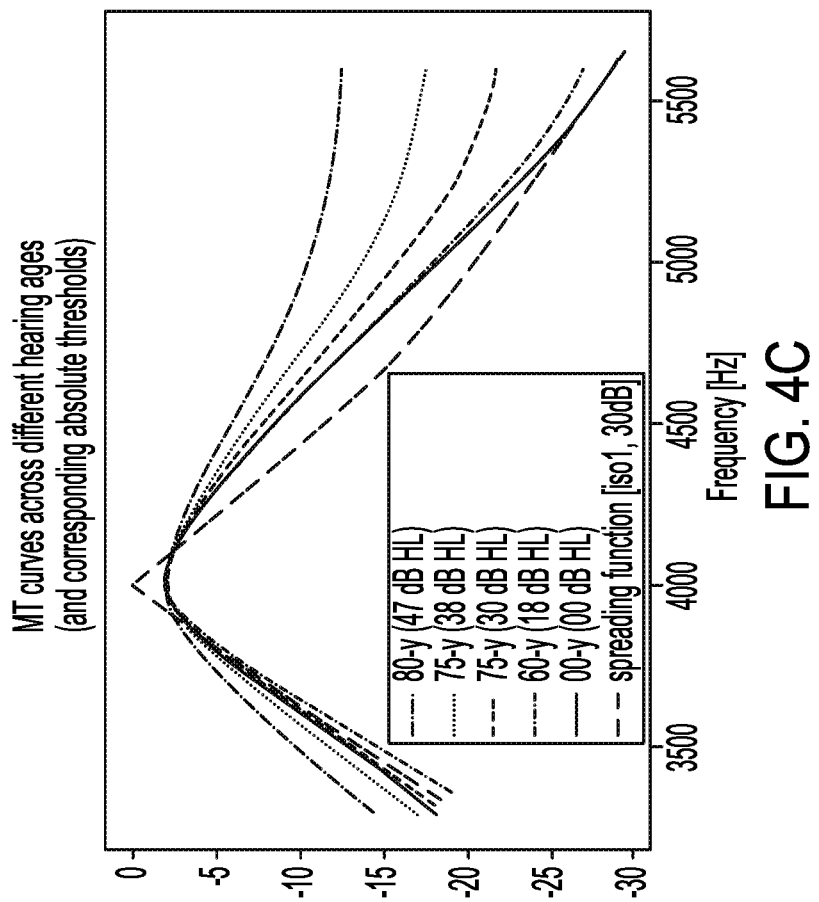
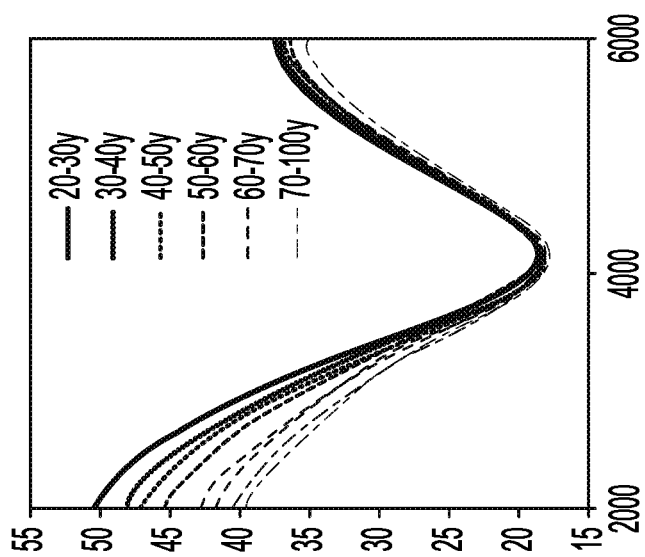
FIG. 4C
FIG. 4B

SYSTEMS AND METHODS FOR SOUND ENHANCEMENT IN AUDIO SYSTEMS

CROSS-REFERENCE TO RELATED APPLICATIONS

This application claims priority to U.S. Provisional Patent Application No. 62/721,417 filed Aug. 22, 2018 and entitled "SYSTEMS AND METHODS FOR SOUND ENHANCEMENT IN AUDIO SYSTEMS," and European Patent Application No. 19163624.0 filed Mar. 19, 2019 and entitled "SYSTEMS AND METHODS FOR SOUND ENHANCEMENT IN AUDIO SYSTEMS," the disclosures of which are both herein incorporated by reference in their entirety.

TECHNICAL FIELD

The disclosed technology relates generally to the fields of digital signal processing (DSP), audio engineering and audiology, and more specifically pertains to systems and methods for processing an audio signal on an audio system to provide an enhanced hearing experience for users, including those that are healthy and those that are hard of hearing.

BACKGROUND

Audio systems, including home entertainment and loudspeaker consumer products, are currently in a status quo of "one sound fits all", and do not provide an optimal sound quality to users. The diversity of different hearing profiles associated with the population of users, taken in conjunction with the increasing proportion of individuals reporting hearing issues, makes it very unlikely that a generic or default audio signal will provide an optimal sound quality and will be perceived at its full potential by all users, or even a majority of users. This problem is noticeable in the broad context of general audio content, and can oftentimes be more particularly noticeable in the context of music content and speech content, e.g., in movies or audio-books.

Accordingly, it would be desirable to provide more accessible techniques for enhancing sound signals on audio systems such as televisions, loudspeaker systems, home cinemas, smart speakers, hearables, smartphones, tablets, computers, car and in-flight entertainment systems in order to thereby provide more effective speech intelligibility, better sound quality, and ultimately a greater enjoyment of sound content by a given user.

SUMMARY OF THE INVENTION

The problems raised in the known prior art will be at least partially solved in the present disclosure as described below. Various features of the present disclosure are specified within the independent claims, certain further implementations of which will be shown in the dependent claims. The features of the claims can be combined in any technically meaningful way, and the explanations from the following specification as well as features from the figures which show additional embodiments of the presently disclosed technology can be considered.

By creating more convenient and effective processing methods that enable seamless sound personalization for users, the presently disclosed technology solves the problems of cost, inconvenience and/or stigmatization posed by conventional solutions. To this extent, aspects of the present disclosure provide for an enhanced hearing experience for one or more users through audio systems personalization.

In general, the presently disclosed technology features systems and methods for audio signal adaptation in entertainment systems. In particular, the methods may be methods of sound personalization to provide an enhanced hearing experience for one or multiple users.

According to an aspect of the present disclosure, an audio processing method may comprise receiving information from one or more users suitable to derive an indication of hearing ability of the one or more users. The audio processing method may further comprise determining a representative indication of hearing ability for the one or more users; determining a set of audio processing parameters for the representative indication of hearing ability; and configuring a sound personalization signal processing algorithm based on the set of audio processing parameters. The representative indication of hearing ability for the one or more users may be a representative hearing age for the one or more users. The audio processing method may further comprise receiving an audio signal on an entertainment system; processing the audio signal using the sound personalization signal processing algorithm; and outputting the processed audio signal from the entertainment system. This allows personalized audio signal processing based on the hearing ability of the one or more users and an enhanced hearing experience for one or more users.

In one embodiment, the information suitable to derive an indication of hearing ability comprises demographic information of the one or more user and the representative indication of hearing ability (e.g. a hearing age) is determined from the demographic information.

In one embodiment, the demographic information of the one or more user comprises at least one of the (biological) sex, the age and the birthdate of the one or more user.

In one embodiment, the information suitable to derive an indication of hearing ability comprises musical preferences of the one or more user. Musical preferences can give indications on the age, and thus on the hearing age of the user based on statistical data.

In one embodiment, the information suitable to derive an indication of hearing ability comprises hearing test results of the one or more user. The hearing test results can then be used to derive a hearing age for the one or more user.

In one embodiment, the demographic information is manually inputted by the one or more user. For example, a user inputs his sex, age and/or date of birth.

In one embodiment, the demographic information is retrieved from the one or more user's social media account or from the one or more user's personal account supporting video, photo, music playback, video recording functionality. These data sources allow easy access to demographic information which can be automatically extracted and retrieved.

In one embodiment, the demographic information of the one or more user is ascertained using a voice recognition algorithm or a facial recognition algorithm. Such algorithms allow automatically deriving demographic information for a user.

In one embodiment, the sound personalization signal processing algorithm is a multiband compression algorithm. Multiband compression algorithms allow for a variety of signal manipulations based on controllable parameters that can be personalized based on the representative indication of hearing ability (e.g. hearing age). Other parameterized signal processing algorithms may be used as well, e.g. frequency dependent equalizers.

In one embodiment, the parameters of the multiband compression algorithm comprise the threshold value of a dynamic range compressor provided in each subband, and the ratio value of a dynamic range compressor provided in each subband.

In one embodiment, the parameters of the multiband compression algorithm further comprise a gain value provided in each subband.

In one embodiment, the receiving the audio signal comprises receiving the audio signal from a storage device or from a transmitter. The storage device may be a fixed storage device (e.g. a hard disk or solid state memory) of the entertainment system. Alternatively, the audio signal may be received via wireless or wireline communication system such as radio waves, unicast, multicast, or broadcast transmission, cable systems, internet, etc.

In one embodiment, determining a set of audio processing parameters for the representative indication of hearing ability comprises deriving the set of audio processing parameters from a table of pre-stored audio processing parameters for different anchor indications of hearing ability. In embodiments, the table stores audio processing parameters for different hearing ages.

In one embodiment, determining a set of audio processing parameters for the representative indication of hearing ability further comprises interpolating the set of audio processing parameters for the indication of hearing ability based upon the pre-stored audio processing parameters for different anchor indications of hearing ability.

In one embodiment, the representative indication of hearing ability is determined based upon the hearing test results of the one or more user, in particular by comparing the hearing test results with reference or representative hearing test results for different indications of hearing abilities and determining a closest match. The reference or representative hearing test results can be standard hearing test results corresponding to a specific age or ages. Through the collection of large datasets, key age trends can be ascertained, allowing for the accurate parameterization of personalization DSP algorithms. The hearing test results may be based upon at least one of a suprathreshold test, a psychophysical tuning curve, a masked threshold test or further tests involving a masking paradigm, a threshold test and an audiogram. Other hearing tests that allow driving indication of hearing ability (e.g. hearing age) may be used as well.

In one embodiment, the determining a set of audio processing parameters comprises determining the set of audio processing parameters by optimizing perceptual relevant information for the one or more user based on the hearing test results. For example, the optimization of perceptual entropy for an audio sample based on an indication of hearing ability of a user can be used to determine the audio processing parameters.

In one embodiment, the information suitable to derive an indication of hearing ability is received at a server where representative the indication of hearing ability and the set of audio processing parameters are determined. The method may further comprise transmitting the set of audio processing parameters to the entertainment system.

In one embodiment, the entertainment system comprises a control unit and headphones, the audio signal processed on the control unit or the headphones and outputted from the headphones. A control unit is herein defined as the processing module to which the set of audio processing parameters are transferred for configuring the signal processing algorithm which then processes the audio signal.

In one embodiment, information to derive an indication of hearing ability for a plurality of users is received and the representative indication of hearing ability for the plurality of users is determined, in particular by selecting the youngest indication of hearing ability of the users (e.g. selecting the youngest hearing age for the users). Other methods like averaging hearing ages are possible, too.

According to an aspect of the present disclosure, a system for multiple users may comprise a stored program causing a processor of an entertainment system, when executed on the processor, to perform audio processing according to the audio processing method.

According to an aspect of the present disclosure, a computer program product comprising instructions that when executed on an entertainment system, cause a processor to perform the audio processing method.

The above aspects disclosed for a method can be applied in the same manner to the system and computer program product likewise.

Unless otherwise defined, all technical terms used herein have the same meaning as commonly understood by one of ordinary skill in the art to which this technology belongs.

The term "hearing profile", as used herein, is defined as the representative hearing data reflecting a user's hearing ability. It may be derived from an individual's demographic information, or from a hearing test, for example from an audiogram, or from suprathreshold data, such as a psychophysical tuning curve across the hearing spectrum.

The term "sound personalization", as used herein, is defined as any digital signal processing (DSP) algorithm that processes an audio signal to enhance the clarity of the signal to a user. The DSP algorithm, for example, may comprise a multiband compressive system and/or employ equalization techniques parameterized according to the calculated hearing profile of a user.

The phrase "demographic information", as used herein, is defined as the characteristics of an individual, such as age, (biological) sex and ethnicity, which bear informational value for statistical purposes, such as, for example, hearing ability. An individual's hearing ability is known to be correlated with the individual's age. An individual's hearing ability may be correlated with the individual's biological sex: typically, male individuals may hear slightly worse than female individuals.

The term "audio entertainment system", as used herein, may refer to a home entertainment system, such as a television, home cinema, home theater, a system reproducing a movie theater experience and mood, using video and audio equipment, a home theater personal computer, a media center appliance, a device that combines abilities of a personal computer with a software application supporting video, photo, music playback, video recording functionality, Hi-Fi systems, and loudspeaker systems. It may further refer to an entertainment system in a car, to an in-flight entertainment system in a back seat, or generally to any device outputting audio signals, such as a smartphone, a tablet, a hearable, a smart speaker or a computer.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof, which are illustrated in the appended drawings. Understand that these drawings depict only exemplary embodiments of the disclosure and are not therefore to be considered to be limiting of its scope, the principles herein are described and explained with additional specificity and detail through the use of the accompanying drawings in which.

DETAILED DESCRIPTION

Figure 1:
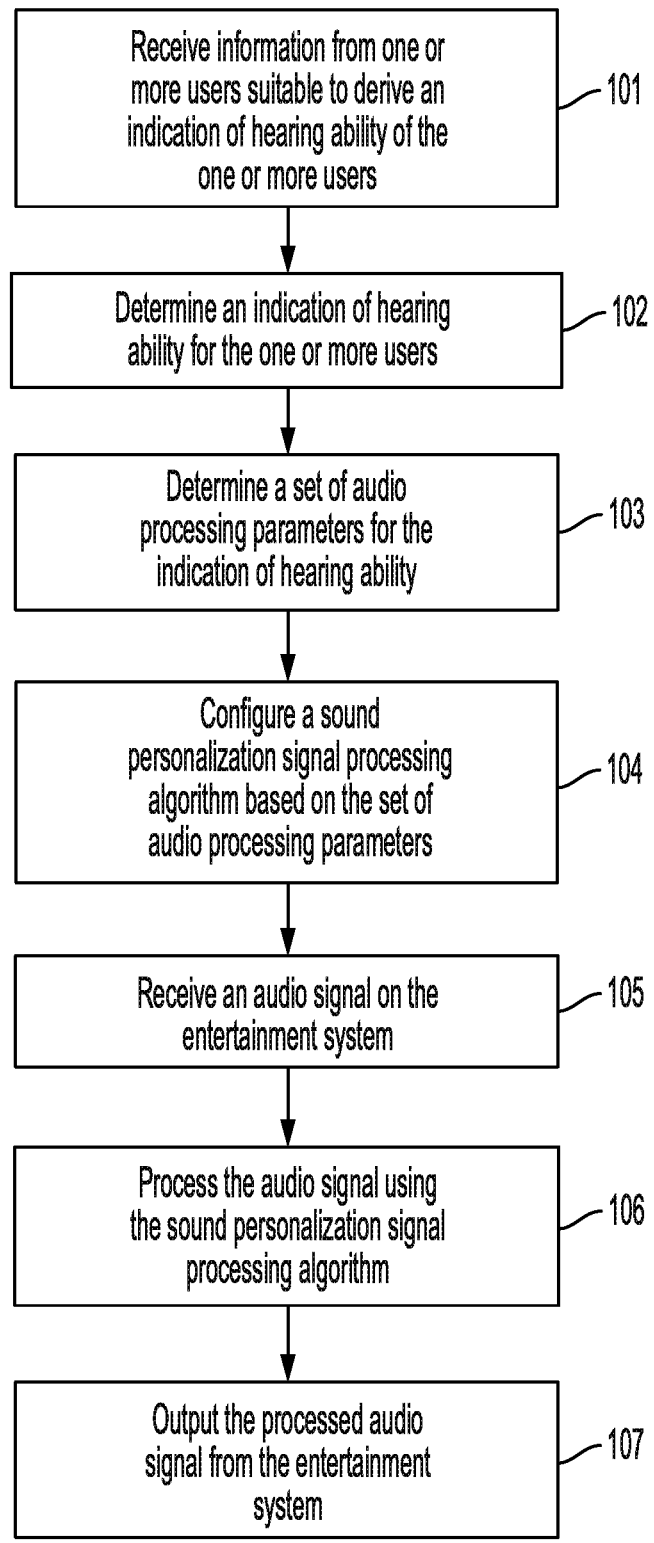
FIG. 1 illustrates an example method of the audio processing method according to one or more aspects of the present disclosure.

Various example embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure. Thus, the following description and drawings are illustrative and are not to be construed as limiting the scope of the embodiments described herein. Numerous specific details are described to provide a thorough understanding of the disclosure. However, in certain instances, well-known or conventional details are not described in order to avoid obscuring the description. References to one or an embodiment in the present disclosure can be references to the same embodiment or any embodiment; and, such references mean at least one of the embodiments.

Reference to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others.

The terms used in this specification generally have their ordinary meanings in the art, within the context of the disclosure, and in the specific context where each term is used. Alternative language and synonyms may be used for any one or more of the terms discussed herein, and no special significance should be placed upon whether or not a term is elaborated or discussed herein. In some cases, synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any example term. Likewise, the disclosure is not limited to various embodiments given in this specification.

Without intent to limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, technical and scientific terms used herein have the meaning as commonly understood by one of ordinary skill in the art to which this disclosure pertains. In the case of conflict, the present document, including definitions will control.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

Various example embodiments of the disclosure are discussed in detail below. While specific implementations are discussed, it should be understood that this is done for illustration purposes only. A person skilled in the relevant art will recognize that other components and configurations may be used without departing from the spirit and scope of the present disclosure.

EXAMPLE EMBODIMENTS

The disclosure turns now to FIG. 1, which is a flowchart illustrating the successive steps of the audio processing method according to aspects of the present disclosure.

In step 101, information from one or more users suitable to derive an indication of hearing ability of the one or more users is received. Information suitable to derive an indication of hearing ability may comprise demographic information, such as the one or more user's biological sex, age, birthdate or year of birth. Information suitable to derive an indication of hearing ability may further comprise the musical preferences of the one or more users. Furthermore, information suitable to derive an indication of hearing ability may comprise hearing test results of the one or more users. The hearing test results may comprise suprathreshold test results, such as the results of test involving a masking paradigm (such as a masked threshold test or a psychoacoustic tests), an audiogram, or other hearing test results.

The information may be manually inputted on a device. The information may also be obtained by voice recognition software configured to identify the user by his voice and access a corresponding personal profile of the user, which comprises information suitable to derive an indication of the user's hearing ability. The information may also be stored on the memory of the device. The information may further be obtained from the one or more user's social media account or from the one or more user's personal account supporting video, photo, music playback or video recording functionality. Further ways of receiving information suitable to derive an indication of hearing ability is through a voice recognition algorithm, a facial recognition algorithm, physiological parameters of the user, a user's musical preferences, or accessing the user's time and location. Step 101 may occur on a server or on an offline module located on a user device such as a smart phone, tablet or any entertainment device.

In step 102, an indication of hearing ability is determined for the one or more users. The indication of hearing ability may be derived the information received in step 101. An indication of hearing ability may be an assumed hearing age, i.e. an age reflecting the user's hearing ability compared to a user with healthy hearing. The hearing age may be assumed to correspond to the user's actual age. Namely, the user's actual age may be calculated by subtracting the user's birthdate to the date of the present day. The hearing age may also be determined from the results of one or more hearing tests. In this case, the hearing age may be similar or different from the user's actual age. In one embodiment, an average of the hearing age and the actual age of the user may be calculated in order to obtain the indication of the user's hearing ability. An indication of hearing ability may be static, i.e. generated once and then saved, or may be dynamic, i.e. generated and then updated whenever new information relevant to a given indication of hearing ability (e.g. a hearing profile) and its associated user is received. In the case where pre-constructed indications of hearing ability are used, they may be stored remotely (e.g. on a server), locally (e.g. on an offline module located on a device, for example on the entertainment system), or in some combination of the two.

In step 103, a set of audio processing parameters are determined for the indication of hearing ability. In one embodiment, a set of audio processing parameters may be derived from a table of pre-stored audio processing parameters for different anchor indications of hearing ability. The anchor indications of hearing abilities may be a selection of hearing ages, each having their associated set of audio processing parameters. Particularly, a set of audio processing parameters may be interpolated based on such a table of pre-stored audio processing parameters. For example, if the user's indication of hearing ability does not correspond to an anchor indications of hearing abilities (e.g. to anchor hearing ages), the set of audio processing parameters may be interpolated from the adjacent indications of hearing abilities. In one embodiment, the interpolation may be a linear interpolation. In one embodiment, the user's hearing test results may be compared with reference or representative hearing test results for different indications of hearing abilities (e.g. hearing ages) in order to determine a closest match. The hearing test results may be based upon at least one of a suprathreshold test, a psychophysical tuning curve, a masked threshold test or further tests involving a masking paradigm, a threshold test and an audiogram. Other hearing tests that allow driving indication of hearing ability (e.g. hearing age) may be used as well. Through the collection of large datasets, key age trends can be ascertained, allowing for the accurate parameterization of personalization DSP algorithms. The closest matching reference or representative hearing test result can then be used to determine the indication of hearing abilities for the user. For example, the reference or representative hearing test results are marked with corresponding hearing ages and the hearing age of the closest matching reference/representative hearing test result is assigned as hearing age for the user. The set of audio processing parameters may be derived by interpolation of the set of audio parameters corresponding to the closest match. The set of audio parameters may also be derived from the user's hearing test results. For instance, masking contour curve data, such as masked threshold data or psychoacoustic tuning curve data, may be used to calculate ratio and threshold parameters for a given frequency sub-band, while audiogram data may be used to calculate gain within a given frequency sub-band. In one embodiment, the set of audio processing parameters is determined based on the optimisation of perceptual relevant information for the one or more user based on the hearing test results.

In step 104, a sound personalization signal processing algorithm may be configured based on the set of audio processing parameters. The sound personalization signal processing algorithm may be executed on an audio entertainment system.

In step 105, an audio signal is received on the audio entertainment system, such as a television, a home cinema, a home theater, a media center appliance, a device that combines abilities of a personal computer with a software application supporting video, photo, music playback, video recording functionality, Hi-Fi systems, and loudspeaker systems, an entertainment system in a car, to an in-flight entertainment system in a back seat, a smartphone, a tablet, a hearable, a smart speaker or a computer. It should be noted that the audio entertainment system is not a hearing aid that picks up sound in real-time and plays the processed sound via an in ear device to the user.

The audio signal may be received from a storage device of the audio entertainment system such as a hard disk or a music CD/DVD. Alternatively, the audio signal may be received by a receiver of the audio entertainment system from an external transmitter, via a wired or wireless transmission path such as an audio streaming path or a radio broadcasting service. Typically, the audio signal is not recorded in real time by the entertainment system but is received from a local or remote storage device where it has been stored.

In step 106, the audio signal is processed using the sound personalization signal processing algorithm. In other words, the sound personalization signal processing algorithm is applied to the audio signal and changes the signal characteristics so as to provide an enhanced hearing experience for one or more users. In embodiments, the sound personalization signal processing algorithm is a multiband dynamic range compression algorithm.

In step 107, the processed audio signal is outputted from the entertainment system and played back to the one or more users, e.g. via a transducer such as a loudspeaker or headphones.

Figure 2:
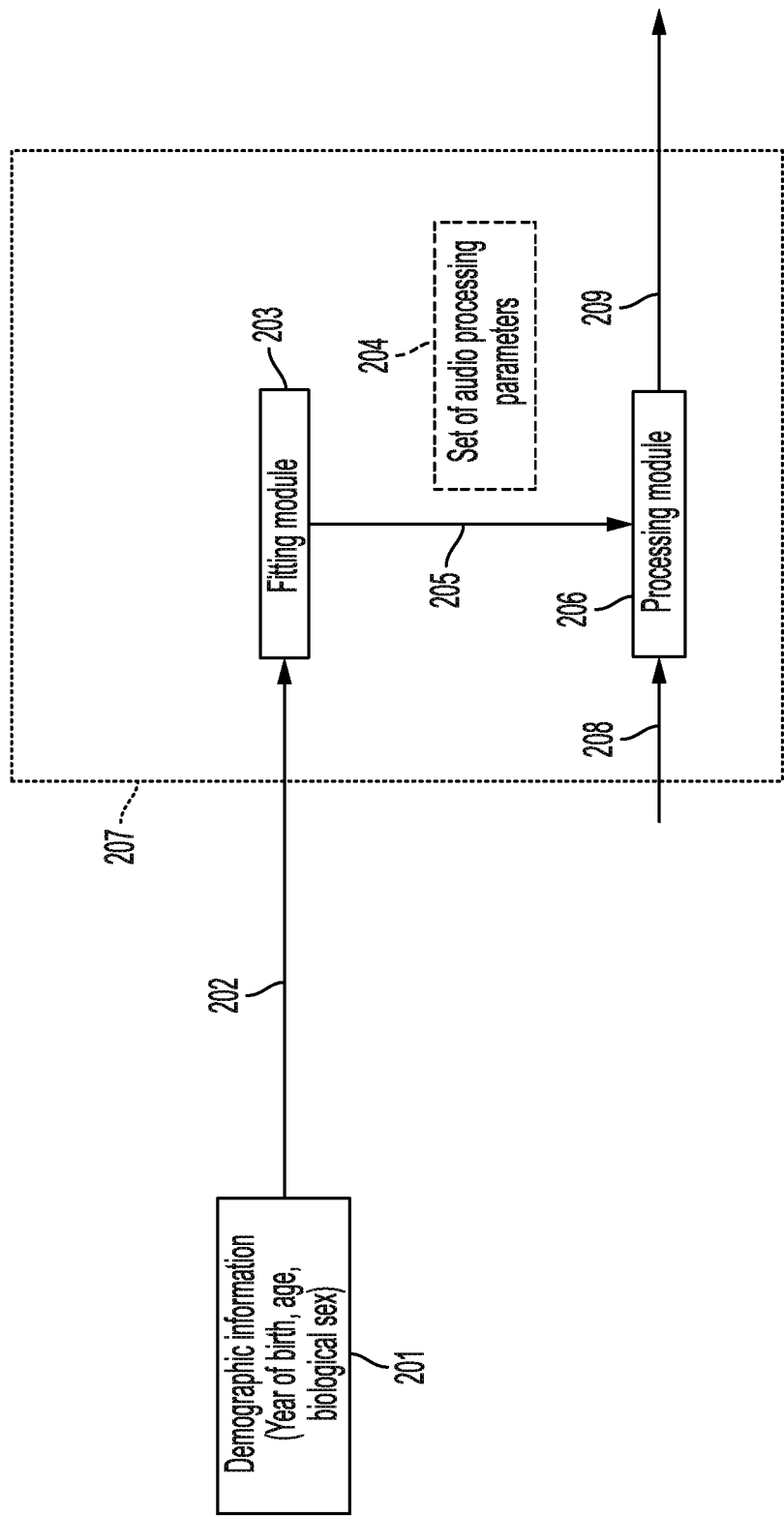
FIG. 2 illustrates an example embodiment of the audio processing method according to one or more aspects of the present disclosure.

FIG. 2 depicts an example embodiment incorporating aspects of the present disclosure, in which demographic information 201 is inputted, e.g. manually inputted, on a user device. The user manually inputs his/her year of birth and optionally his/her biological sex. The user device may be part of the entertainment system 207, or may be a separate device.

At 202, the inputted information is transmitted to a fitting module 203. The fitting module has the ability to work offline and may be integrated into the entertainment system 207. The age of the user can be calculated by subtracting the year of birth or the birthdate to the current year (or date of the day) on the fitting module 203.

A plurality of anchor ages, each of them corresponding to a set of audio processing parameters, are stored on the fitting module 203.

A set of audio processing parameters corresponding to the user's age is derived by matching the user's age to the two closest anchor ages. The set of audio parameters 204 corresponding to the user's age are determined by linear interpolation methods. This step also occurs on the fitting module 203.

Anchor ages can for example be 18, 45, 60 and 75 years old. The set of audio processing parameters for a user aged 55 will be linearly interpolated from the parameters corresponding to the anchor ages 45 and 60.

In step 205, the set of audio processing parameters 204 corresponding to the user's age are then transferred to a processing module 206. In embodiments, the processing module 206 is also integrated into the entertainment system 207.

An audio input signal enters 208 the processing module 206 on the entertainment system, in which it is processed. The processed audio signal is then outputted 209 from the entertainment system 207.

Figure 3:
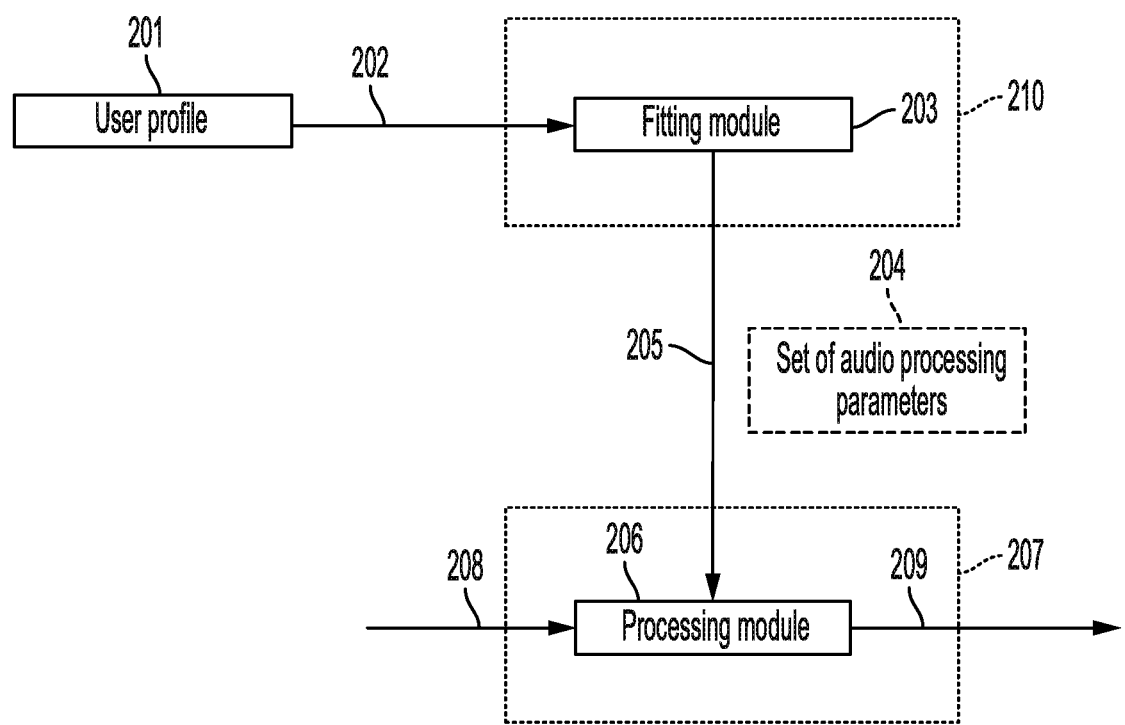
FIG. 3 illustrates another example embodiment of the audio processing method according to one or more aspects of the present disclosure.

FIG. 3 depicts an example embodiment incorporating aspects of the present disclosure, in which a user can create or log in to his/her personal user profile 201 by inputting information such as his/her name, email address, and/or a personal password. In step 202, the inputted information or information from the personal user profile 201 is transmitted to a fitting module 203. The fitting module is located on a server 210. The server 210 accesses data from the users, for example his/her age, date of birth, biological sex, and/or hearing test results.

The audio processing parameters 204 are determined on the fitting module 203, from the user's age by linear interpolation between anchor ages and their corresponding sets of audio processing parameters such as described above with respect to FIG. 2, or by deriving the set of audio processing parameters directly from the user's hearing test results. In step 205, the audio processing parameters 204 are transferred to the processing module 206. The processing module is located on the entertainment system 207.

At 208, an audio input signal enters the processing module 206 on the entertainment system 207, in which it is processed. The processed audio signal is then outputted 209 from the entertainment system 207.

Figure 4A:
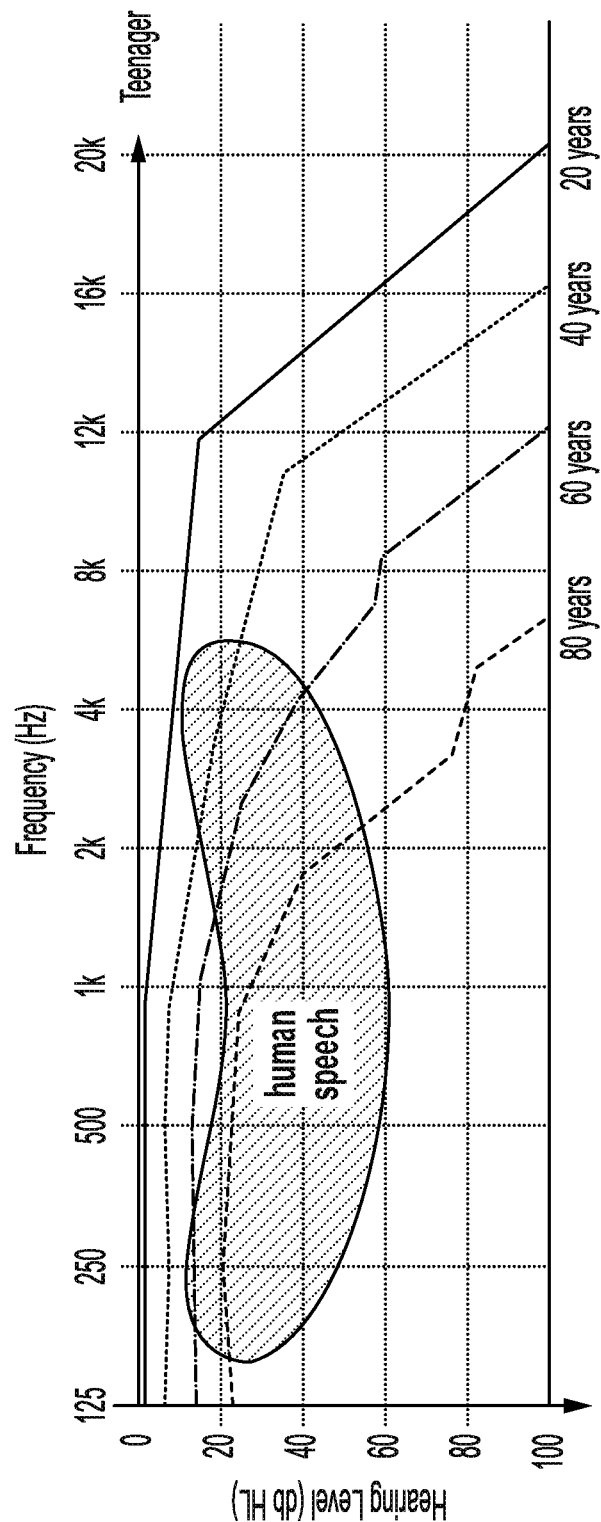
FIGS. 4 A-C illustrate age trends extracted from PTC and MT data sets.

FIG. 4A illustrates the typical deterioration of a user's hearing ability over time. Past the age of 20 years old, humans begin to lose their ability to hear higher frequencies (albeit above the spectrum of human voice). This steadily becomes worse with age as noticeable declines within the speech frequency spectrum are apparent around the age of 50 or 60. However, these pure tone audiometry findings mask a more complex problem as in that the human ability to understand speech may in fact begin to decline much earlier. Although hearing loss typically begins at higher frequencies, users who are aware that they have hearing loss do not typically complain about the absence of high frequency sounds. Instead, they report difficulties listening in a noisy environment and in hearing out the details in a complex mixture of sounds, such as in a telephone call. In essence, off frequency sounds more readily mask a frequency of interest for hearing impaired individuals—conversation that was once clear and rich in detail becomes muddled. As hearing deteriorates, the signal-conditioning abilities of the ear begin to break down, and thus hearing-impaired users need to expend more mental effort to make sense of sounds of interest in complex acoustic scenes (or miss the information entirely). A raised threshold in an audiogram is not merely a reduction in aural sensitivity, but a result of the malfunction of some deeper processes within the auditory system that have implications beyond the detection of faint sounds. To this extent, the issue of speech clarity is quite widespread.

FIGS. 4B-C illustrate how large hearing datasets enable more accurate demographic estimation of a user's hearing ability. The PTC test (FIG. 4B) is a suprathreshold test that measures an individual's ability to discern a probe tone (or pulsed signal tone) against a sweeping masker noise of variable frequency and amplitude. For example, here, the psychophysical tuning curve test may be measured for signal tones between frequencies of 500 Hz and 4 kHz, and at a sound level of between 20 dB SL and 40 dB SL, in the presence of a masking signal for the signal tone that sweeps from 50% of the signal tone frequency to 150% of the signal tone frequency. Through the collection of large datasets, such as the one shown in FIG. 4B, key age trends can be ascertained, allowing for the accurate parameterization of personalization DSP algorithms. In a multiband compressive system, for example, the threshold and ratio values of each sub-band signal dynamic range compressor (DRC) can be modified to reduce problematic areas of frequency masking, while post-compression sub-band signal gain can be further applied in the relevant areas. Masked threshold curves 202 represent a similar paradigm for measuring masked threshold. A narrow band of noise, in this instance 202 around 4 kHz, is fixed while a probe tone sweeps from 50% of the noise band center frequency to 150% of the noise band center frequency. Again, key age trends can be ascertained from the collection of large MT datasets. In some embodiments, datasets such as the one depicted in FIG. 4C can be pre-processed or otherwise analyzed and modified to thereby prepare the raw input data for use in the aforementioned parameterization of personalization DSP algorithms. For example, in some embodiments the dataset can be analyzed to detect and remove various outlier data entries, wherein the outlier data entries are those determined to constitute invalid test results. Invalid test results can be identified or otherwise detected on the basis of statistical factors such as the length of the test (e.g. extraordinarily long or short testing periods are more likely to be invalid tests), the button or UI input received from the user being tested (e.g. a disproportionately large or small number of button presses or UI inputs), etc. can all be employed in this analysis.

Figure 5:
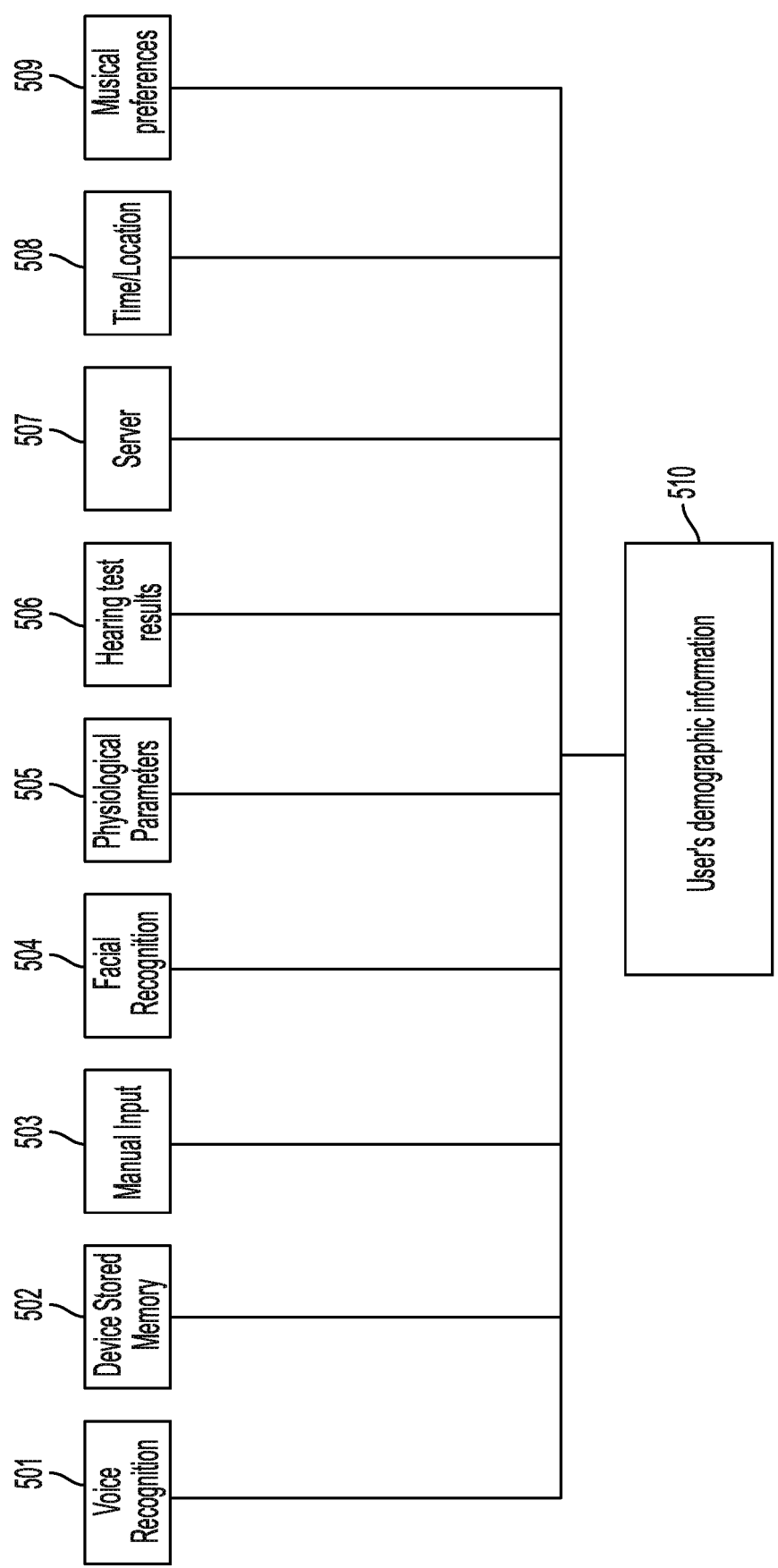
FIG. 5 illustrates exemplary data sources for receiving a user's information suitable to derive an indication of hearing ability and determining an indication of hearing ability.

FIG. 5 illustrates various input sources from which a user's demographic information 510 may be obtained. Demographic information 510 can include, but is not limited to: age, sex, country of residence, country of birth, etc. Although described separately, it is appreciated that one or more of these input sources can be utilized in combination, either separately or in cooperation, without departing from the scope of the present disclosure. In one embodiment 501, age and sex demographic information of one or more users may be obtained by using a speech recognition algorithm to process the user's voice. Such speech recognition algorithms can be applied in substantially real time, can be applied to a previously recorded sample of a user speaking, or both. More particularly, age and sex of a given user can be estimated from a combination of vocal tract length (vtl) and pitch, both of which can be extracted from vowel sounds in the user's speech sample. For example, children will generally have short vtls and high pitch, adult males will generally have a low pitch and long vtls, and adult women will generally have fairly long vtls and higher pitch (see e.g., Metze, F., Ajmera, J., Englert, R., Bub, U., Burkhardt, F., Stegmann, J., . . . & Littel, B., 'Comparison of Four Approaches to Age and Gender Recognition for Telephone Applications', 2007 *IEEE International Conference on Acoustics, Speech and Signal Processing*, ICASSP'07 Vol. 4, pp. IV-1089).

In another embodiment 502, age and sex demographic information of one or more users may be retrieved from a stored memory of an entertainment system. For example, age data of the user can be retrieved from a birth date associated with a contact card, contact list, calendar entry, etc., that is provided on or otherwise accessible to the entertainment system. In some embodiments 503, age and sex demographic information of an intended user can be manually input by the user prior to using the entertainment system. In some embodiments 504, age and sex demographic information of an intended user can be obtained through facial recognition technology, such as from the camera of a mobile phone or the entertainment system. In some embodiments 505, physiological measurements may be used, such as heart rate, blood pressure and/or tremoring of the hands. In some embodiments 506, threshold and suprathreshold hearing test results may be used. In some embodiments 507, a user or intended user's demographic information can be obtained from a server (e.g. wireless network connection), e.g. from a social media account (Facebook, Twitter, LinkedIn, etc.) of the user or intended user. In some embodiments 508, time and location of a user may be used to determine DSP parameterization, e.g. applying more gain if an individual is in a noisy location. In some embodiments 509, a user's demographic information may be derived from his musical preferences. This may be based on musical genres and average demographic information (i.e. the age) of a certain musical genre's audience. It may further be based on statistical data on the average demographic information (i.e. the age) of the audience of an artist, album, or track.

Figure 6:
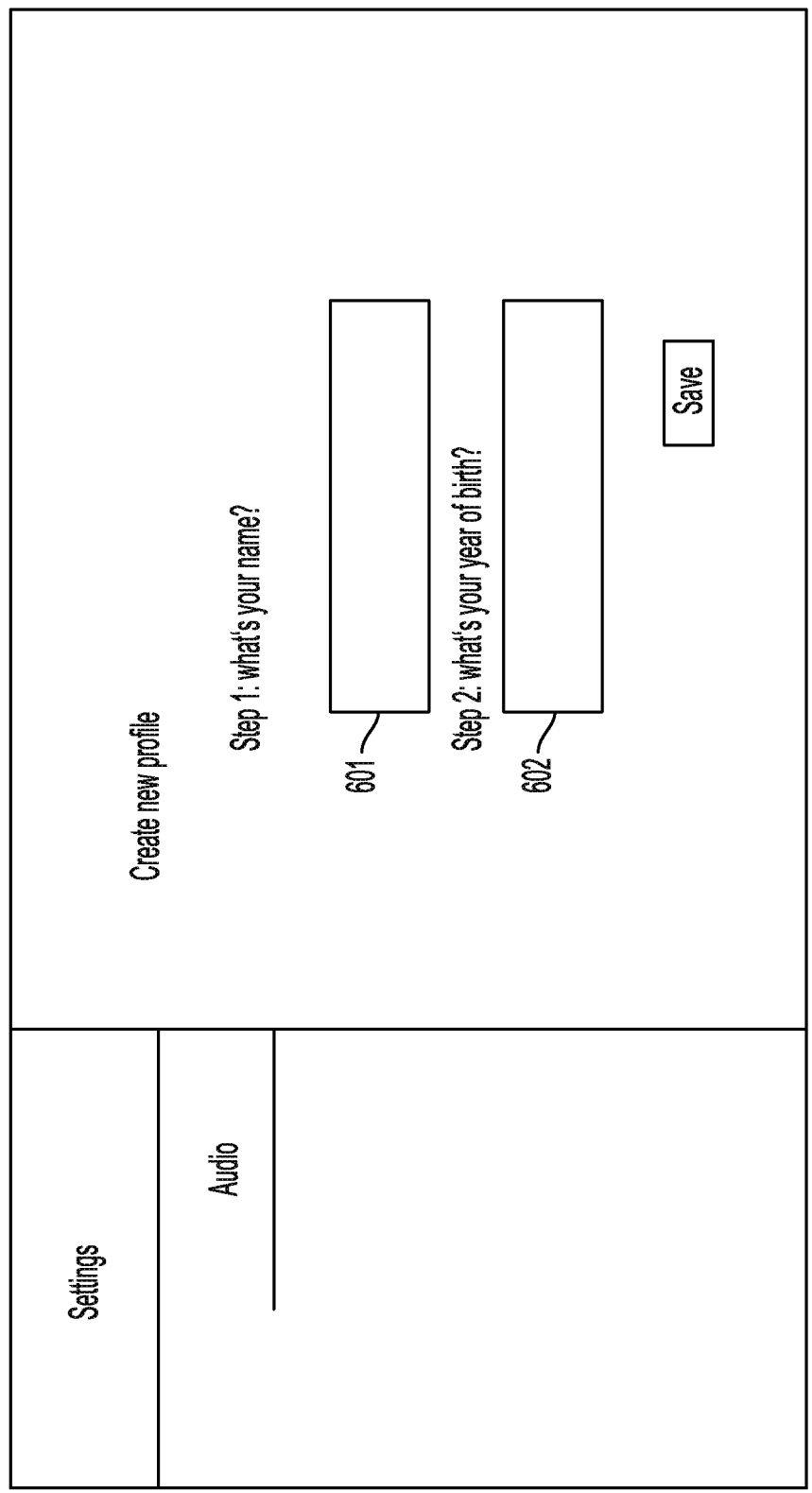
FIG. 6 illustrates an example interface for setting up an individual user profile.

FIG. 6 illustrates an example user interface of the present disclosure. The example user interface can be shown, for example, on the screen of a home entertainment system to create a new user profile. Such a user profile can be employed according to one or more aspects of the present disclosure in providing sound personalization of one or more audio signals (either standalone or derived from multimedia content such as video, television broadcasts, movies, etc.). As illustrated, the user interface can prompt the user to create a new profile, i.e. 'Create New Mimi Profile'. In a first entry field 601, a given user enters his or her name, and in a second entry field 602, the given user enters his or her year of birth. In some embodiments, the user interface can provide prompts and/or clarifying information, e.g. providing reassurance that 'your year of birth serves as a standard for your unique sound'. In this manner, user compliance can be increased by providing reassurance and clarification that this personal information (or other demographic information of the given user) will be used in an appropriate manner. In some embodiments, one or more of the entry fields 601, 602 can be manually filled by the given user, either using a hardware input device (TV remote control, smartphone, dedicated controller) or a software input mechanism (voice recognition, etc.).

Figure 7:
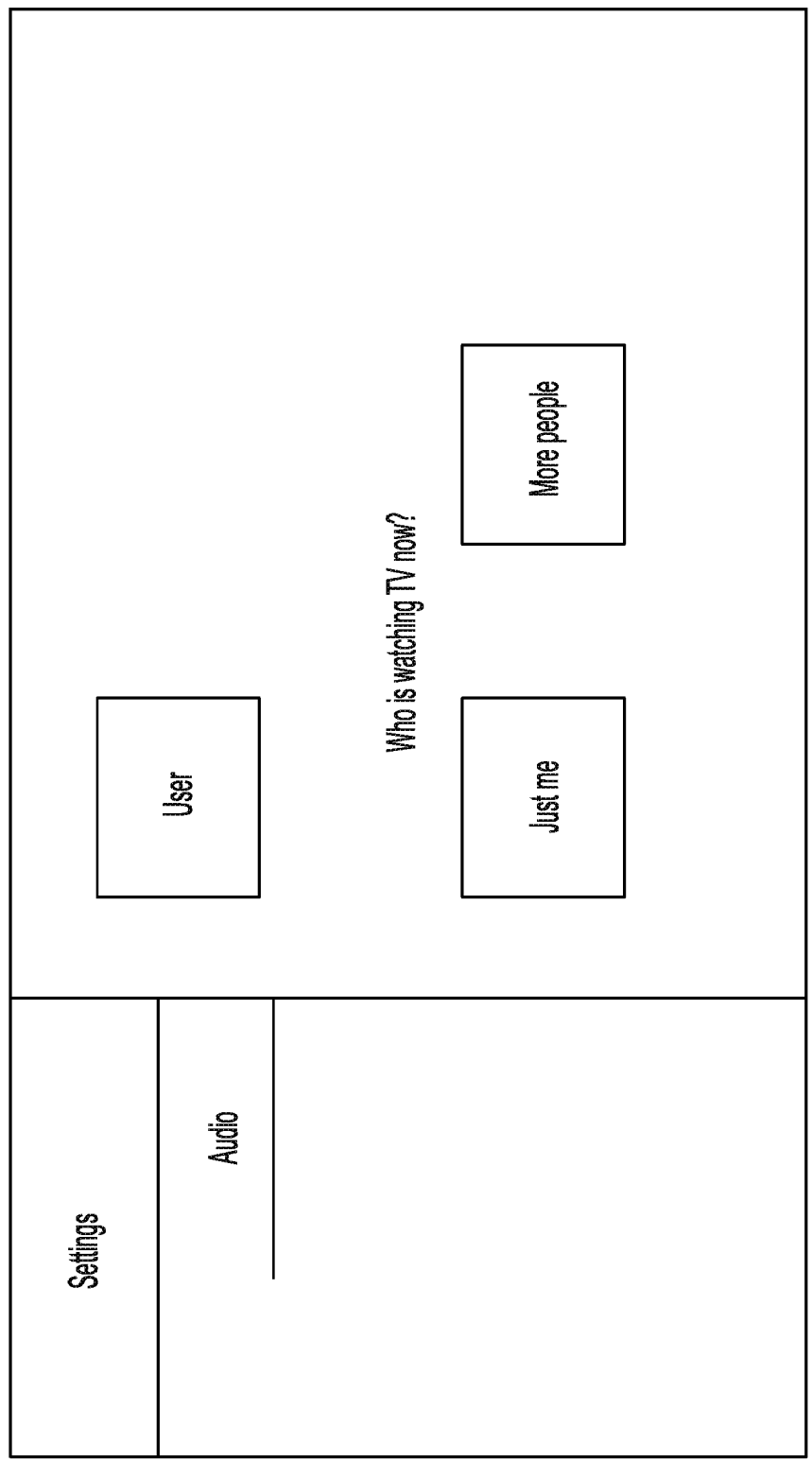
FIG. 7 illustrates an example interface for setting up one or more user profiles.

FIG. 7 illustrates an additional example user interface of the present disclosure. As shown, this user interface allows for selection between different stored or already configured user profiles (such as those of FIG. 6). In some embodiments, the user interface may be used to select only a single user's profile (corresponding to the option 'Who is watching TV now?—Just me'). In some embodiments, the user interface may be used to select a multi-user user profile or a multi-user listening experience (corresponding to the option 'Who is watching TV now?—More people'). The number of users can be inputted manually or can be derived automatically, e.g. through a camera system or other external sensor (s) coupled to the television and/or sound personalization system of the present disclosure.

Figure 8:
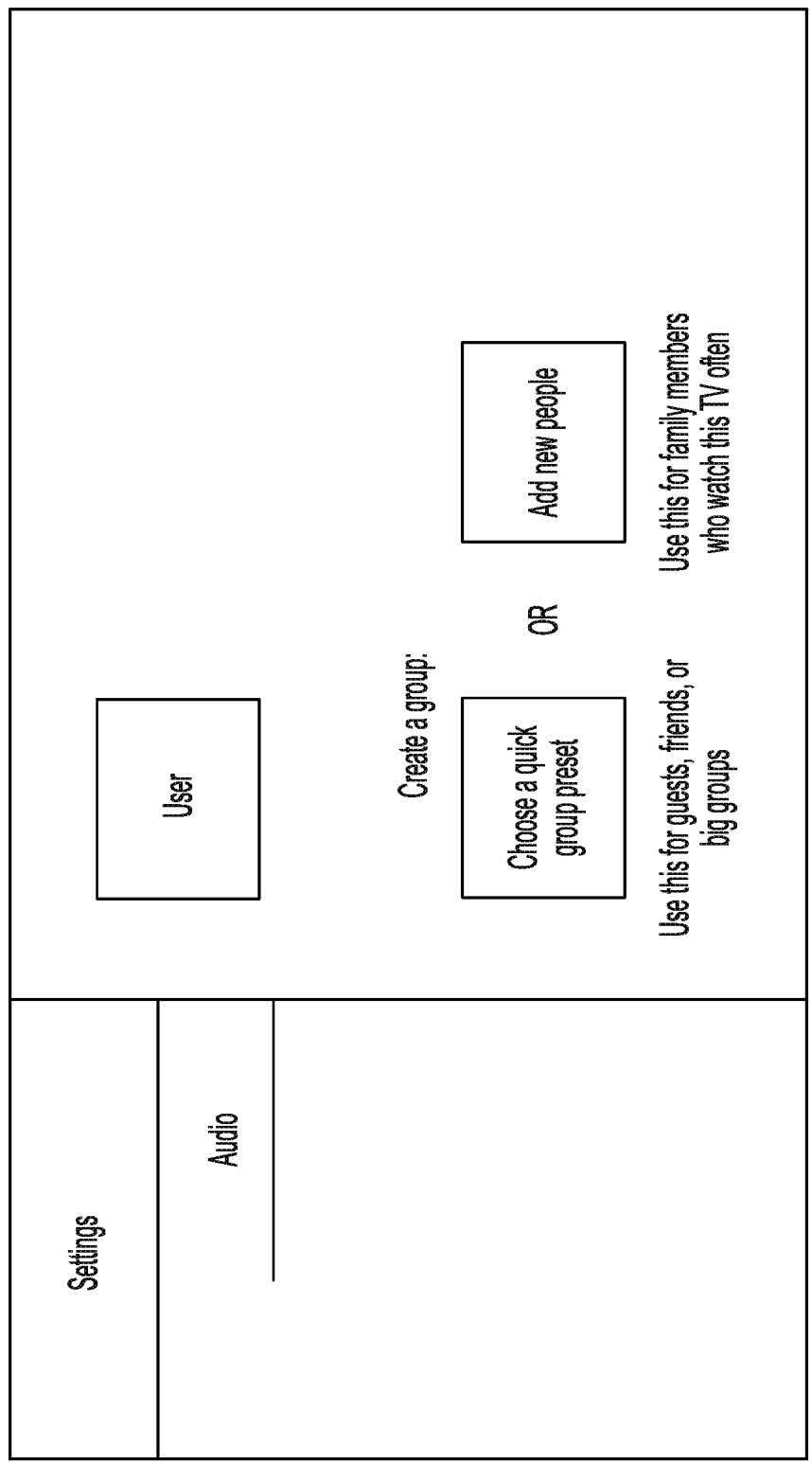
FIG. 8 illustrates an example interface for group settings.

FIG. 8 illustrates an example user interface corresponding to the selection of a multi-user user profile or a multi-user listening experience (i.e. selection of the 'Who is watching TV now?—More people' option of FIG. 7). In particular, FIG. 8 depicts two further options corresponding to group sound personalization. In a first option (shown as the leftmost option of the two), a user may elect to choose a quick group preset, which is one of a set of standard group presets. This option can be best for large groups of new, unknown, or otherwise unregistered (with the sound personalization system) individuals. In a second option (shown as the right-most option of the two), a user may elect to add new profiles, i.e. such that a profile exists for all individuals (or a majority of individuals) in the group. This option can be best for group viewing and listening scenarios in which the members of the group will often be viewing or listening together, e.g. the group consists primarily of family members or individuals living together in the same house. One way of achieving group personalization would be to create group presets corresponding to a decade (seventies, eighties, nineties, etc.) in which the members of the group, or most of the members of the group, were born. In one embodiment, the reference hearing age for the group may correspond to the middle of the decade (i.e. 1975 for the seventies, 1985 for the eighties, etc.). In another embodiment, in which the users are born in different decades, the best presets would be the presets leading to the least processing, in order to avoid any excess of processing that may spoil the quality of the signal for any one of the users. Typically, these would be the presets of the most recent year of birth. In one embodiment, the hearing profile (audiograms or masking curves) of the users are known, and an average of the two or more profiles is calculated.

Figure 9:
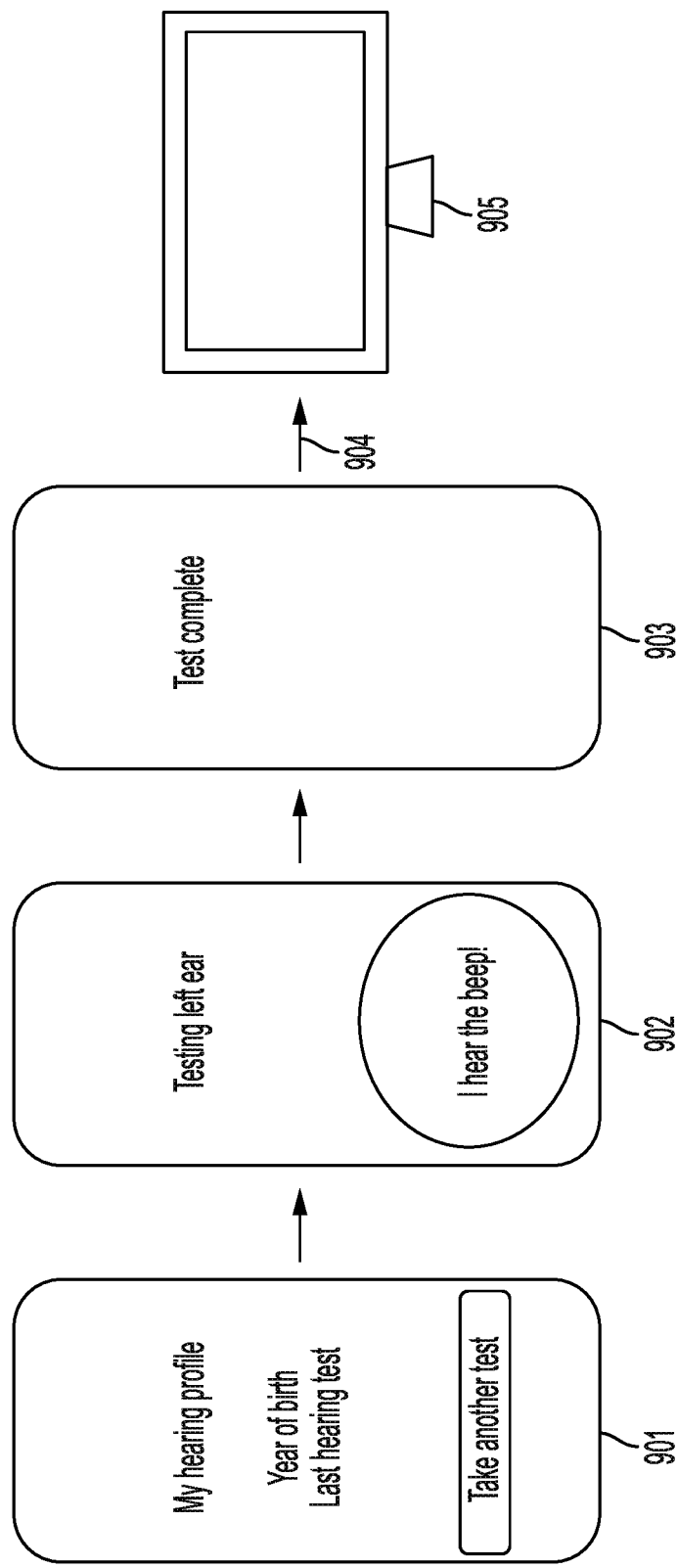
FIG. 9 illustrates a method of setting up a hearing profile from a companion app.

FIG. 9 illustrates an example method of the preset disclosure, the example method for setting up a hearing profile from a companion app, e.g. a companion app running on a smartphone, mobile computing device, or other computing device associated with a user performing the hearing profile setup. This example method can provide a specific embodiment of the process described previously with respect to FIG. 3. Returning to FIG. 9, as illustrated, the companion app is operating on a smartphone. In a first step 901, basic information about the user, such as age, name, contact information, information regarding the user's hearing (pretest) are entered. In a further step 902, the user has the possibility to take a hearing test. The test can be conducted for both ears. In a further step 903, the hearing data is validated, and the user receives information that his profile is updated. A set of audio processing parameters is generated and the audio processing parameters are then transferred in a step 904 to an entertainment system 905.

Figure 10:
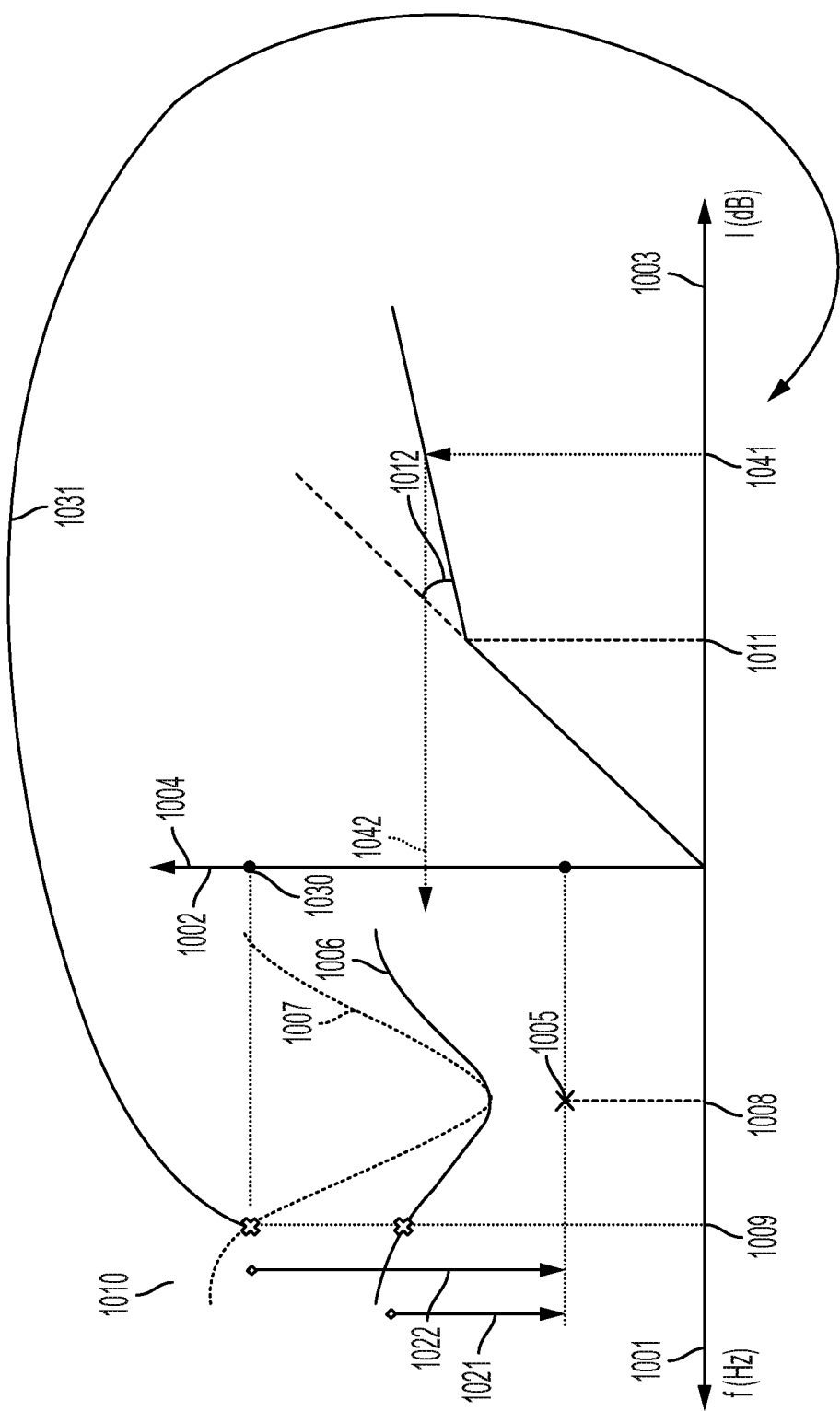
FIG. 10 illustrates one way of determining the audio parameters from hearing test results, more particularly results of hearing tests involving a masking paradigm.

FIG. 10 illustrates one way of determining the audio parameters from hearing test results, more particularly results of hearing tests involving a masking paradigm. FIG. 10 gives one way of setting up the ratio and threshold parameters for a channel (or frequency band) in a multi-band compression system (e.g., at step 103). FIG. 10 combines the visualization of the user masking contour curve 1006 and target masking contour curve 1007 of a constant tone or noise 1005 at a center frequency 1008 (x-axis 1001 being frequency, y-axis 1002 being the sound level in dB SPL or HL) and an input/output graph showing the input level 1003 versus the output level 1004 of a sound signal, in decibels relative to full scale (dB FS). The bisecting line in the input/output graph represents a 1:1 (unprocessed) output of the input signal with gain 1. Parameters of the multi-band compression system in a frequency band 1010 are threshold 1011 and gain 1012. These two parameters are determined from the demographically-estimated masking contour curve 1006 for the user and target masking contour curve 1007.

In the context of the present disclosure, the frequency band 1010 for which the set of parameters should be obtained is selected, and the method of FIG. 1 is performed for that frequency band 1010. As noted above, the masking contour curves(s) are preferably selected such that their center frequency is in a frequency band adjacent to the frequency band in question.

In the context of the present disclosure, a masking contour curve may be obtained by a suprathreshold test relying on a masking paradigm, such as obtaining an individual's psychoacoustic tuning curve, or masked threshold curve. For example, a psychoacoustic test can be conducted by masking of a constant tone or noise 1005 by a masker noise, to thereby obtain a user masking contour curve 1006. At least a part of a user masking contour curve should be in the frequency band 1010 for which the set of parameters should be obtained. The user masking contour curves 1006 may also be stored and accessible from a database or a server, and matched to an individual's hearing age based on statistical averages. The target masking contour curve 1007 is typically "sharper" than the masking contour curves of users with mild, moderate, severe or profound hearing loss, and therefore corresponds to an improvement of the individual's hearing ability.

Depending on the initial hearing ability of the user, fitting the processing according to a reference curve may cause an excess of processing to spoil the quality of the signal. An objective is to process the signal in order to obtain a good balance between an objective benefit and a good sound quality.

The given frequency 1009 is then chosen within the frequency band 1010. It may be chosen arbitrarily, at a certain distance from the center frequency 1008 of the constant tone or noise (which is preferably in the adjacent frequency band or another nearby frequency band). In any case, it is preferred that the given frequency 1009 is in another frequency band 1010 than the center frequency 1008, as noted above. The corresponding sound levels of the user and target masking contour curves are determined at this given frequency 1009. The value of these sound levels may be determined graphically on the y-axis 1002.

The threshold 1011 and ratio 1012 must satisfy the condition that the signal-to-noise ratio 1021 (SNR) of the user masking contour curve at a given frequency 1009 is made to match the SNR 1022 of the target masking contour curve at the same given frequency 1009 by applying the compression system. The SNR is herein defined as the level of the signal tone relative to (i.e. divided by) the level of the masker noise. Hence, the "sharper" the curve, the higher the noise value is, whereas the signal value remains the same.

Typically, in determining the respective masking contour curves, the sound level of the signal tone does not vary, and the noise level varies (noise is sweeping in frequency and level over a constant tone). In this case, the higher the noise level, the smaller the SNR will be (and the lower the noise level (situation of a broad PTC), the higher the SNR will be. In other words, the broader the curve will be, the higher the SNR. The inverse configuration in which the noise level is fixed, and the signal tone varies is also a possible configuration. In this case, the masking contour curves should be rotated 180° around a center point.

The sound level 1030 in dB of the target masking contour curve at a given frequency 1009 corresponds (see bent arrow 1031 in FIG. 10) to an input sound level 1041 entering the compression system. The objective is that the sound level 1042 outputted by the compression system will match the user masking contour curve 1006 at the same given frequency 1009, i.e., that his sound level 1042 is substantially equal to the sound level in dB of the user masking contour curve at the given frequency 1009. This condition allows deriving the threshold 1011 (which has to be below the input sound level, if not, there is no change as below the threshold of the compressor, the system is linear) and the ratio 1012. In other words, input sound level 1041 and output sound level 1042 determine a reference point of the compression curve. Threshold 1011 must be selected to be lower than input sound level 1041. Once the threshold is selected, the ratio 1012 can be determined from the threshold and the reference point.

The right panel in FIG. 10 (see the contiguous graph) illustrates a broken stick DRC (or bent knee or hard knee DRC), with a threshold 1011 and a ratio 1012 as parameters that need to be determined. An input sound signal having a sound level 1030/1041 at a given frequency 1009 enters the compression system. The sound signal should be processed by the DRC in such a way that the outputted sound level is the sound level of the user masking contour curve 1006 at the given frequency 1009. The threshold 1011 should not exceed the input sound level 1041, otherwise compression will not occur. Multiple sets of threshold and ratio parameters are possible. Preferred sets can be selected depending on a fitting algorithm and/or objective fitting data that have proven to show the most benefit in terms of sound quality. For example, either one of the threshold 1011 and ratio 1012 may be chosen to have a default value and the respective other one of the parameters can then be determined by imposing the above-described condition. Another way of selecting a preferred set, is to repeat step 103 (see FIG. 1) at one or more other given frequencies in the channel or frequency band. Having two or more sets of values of outputted sound levels for an inputted sound level may allow the determination of a set of parameters (threshold and ratio, e.g. such as threshold 1011 and ratio 1012) with more accuracy.

Preferably, the ratio is higher than 0.2 (1:5), to avoid excessive compression resulting in an altered audio signal. The ratio should not exceed 1 (1:1), a ratio of 1:1 corresponding to no compression.

For the general case in which no distinction is made between a sweeping noise masking contour curve and a sweeping signal tone masking contour curve, the parameters of the compression system are determined such that application of the compression system to the higher one of the signal level of the user masking contour curve at the given frequency 1009 and the signal level of the target masking contour curve at the given frequency 1009 yields the lower one of the signal level of the user masking contour curve at the given frequency 1009 and the signal level of the target masking contour curve at the given frequency 1009.

In some embodiments, the results of a demographically-estimated audiogram may be used for calculating gain within a sub-band signal. For instance, raised thresholds may be compensated for by a corresponding frequency gain.

Figure 11:
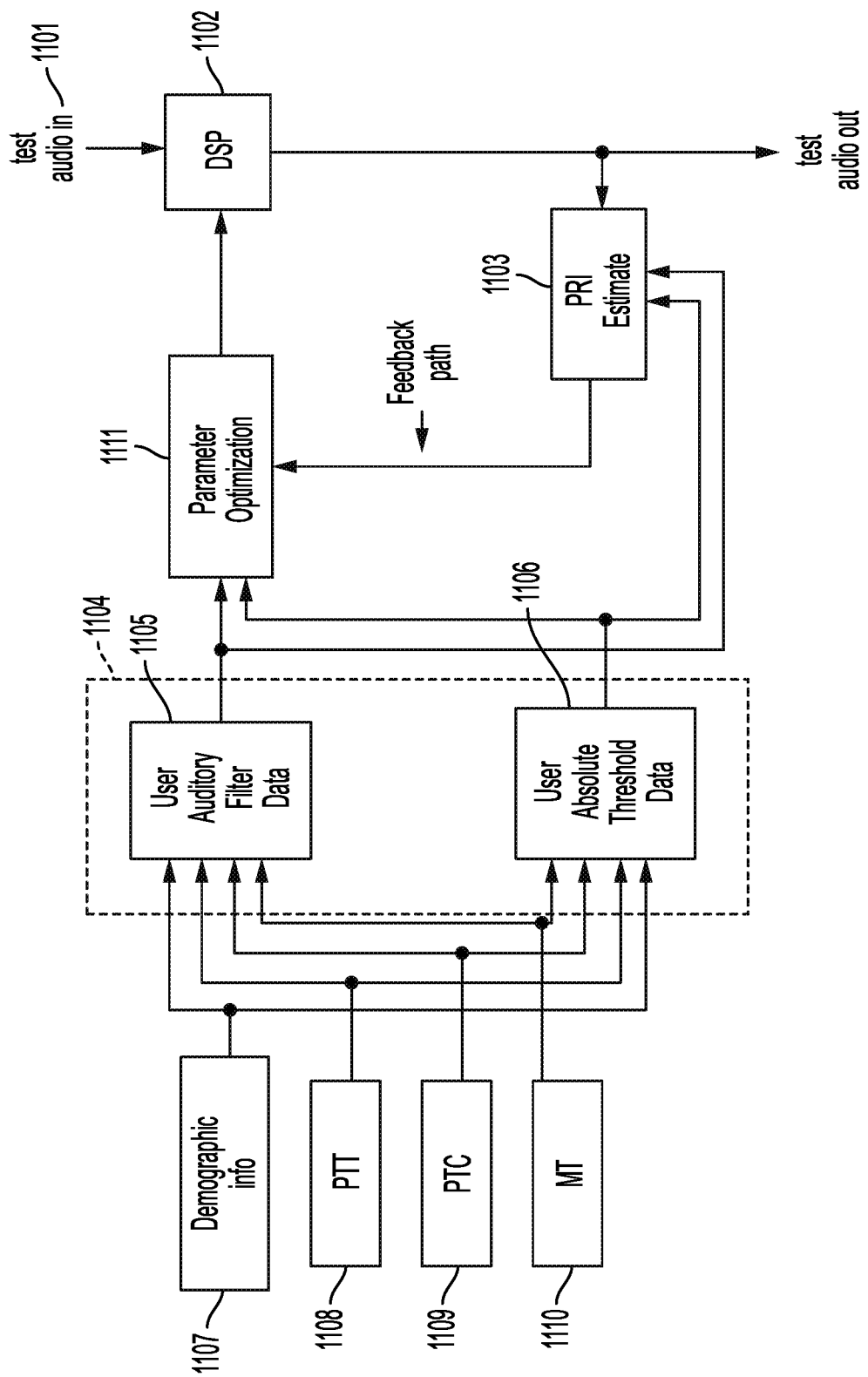
FIG. 11 illustrates a method for obtaining DSP parameters from demographic data through the optimization of perceptually relevant information.

In another embodiment as shown in FIG. 11, DSP parameters in a multiband dynamic processor may be calculated by optimizing perceptual relevant information (e.g. perceptual entropy) through parameterization using demographically-estimated threshold and suprathreshold information (see commonly owned applications U.S. Ser. No. 16/206,376 and EP18208020.0). Briefly, in order to optimally parameterize a multiband dynamic processor through perceptually relevant information, an audio sample 1101, or body of audio samples, is first processed by a parameterized multiband dynamics processor 1102 and the perceptual entropy of the file is calculated 1103 according to demographically-estimate threshold and suprathreshold information 1107. After calculation, the multiband dynamic processor is re-parameterized 1111 according to a given set of parameter heuristics, derived from optimization, and from this—the audio sample(s) is reprocessed 1102 and the PRI calculated 1103. In other words, the multiband dynamics processor is configured to process the audio sample so that it has a higher PRI value for the particular user, taking into account the individual user's demographically-estimated threshold and suprathreshold information 1107. To this end, parameterization of the multiband dynamics processor is adapted to increase the PRI of the processed audio sample over the unprocessed audio sample. The parameters of the multiband dynamics processor are determined by an optimization process that uses PRI as its optimization criteria.

PRI can be calculated according to a variety of methods. One such method, also called perceptual entropy, was developed by James D. Johnston at Bell Labs, generally comprising: transforming a sampled window of audio signal into the frequency domain, obtaining masking thresholds using psychoacoustic rules by performing critical band analysis, determining noise-like or tone-like regions of the audio signal, applying thresholding rules for the signal and then accounting for absolute hearing thresholds. Following this, the number of bits required to quantize the spectrum without introducing perceptible quantization error is determined. For instance, Painter & Spanias disclose a formulation for perceptual entropy in units of bits/s, which is closely related to ISO/IEC MPEG-1 psychoacoustic model 2 [Painter & Spanias, Perceptual Coding of Digital Audio, Proc. Of IEEE, Vol. 88, No. 4 (2000); see also generally Moving Picture Expert Group standards https://mpeg.chiariglione.org/standards; both documents included by reference].

Various optimization methods are possible to maximize the PRI of audio samples, depending on the type of the applied audio processing function such as the above-mentioned multiband dynamics processor. For example, a sub-band dynamic compressor may be parameterized by compression threshold, attack time, gain and compression ratio for each subband, and these parameters may be determined by the optimization process. In some cases, the effect of the multiband dynamics processor on the audio signal is non-linear and an appropriate optimization technique such as gradient descend is required. The number of parameters that need to be determined may become large, e.g. if the audio signal is processed in many subbands and a plurality of parameters needs to be determined for each subband. In such cases, it may not be practicable to optimize all parameters simultaneously and a sequential approach for parameter optimization may be applied. Although sequential optimization procedures do not necessarily result in the optimum parameters, the obtained parameter values result in increased PRI over the unprocessed audio sample, thereby improving the user's listening experience.

Figure 12:
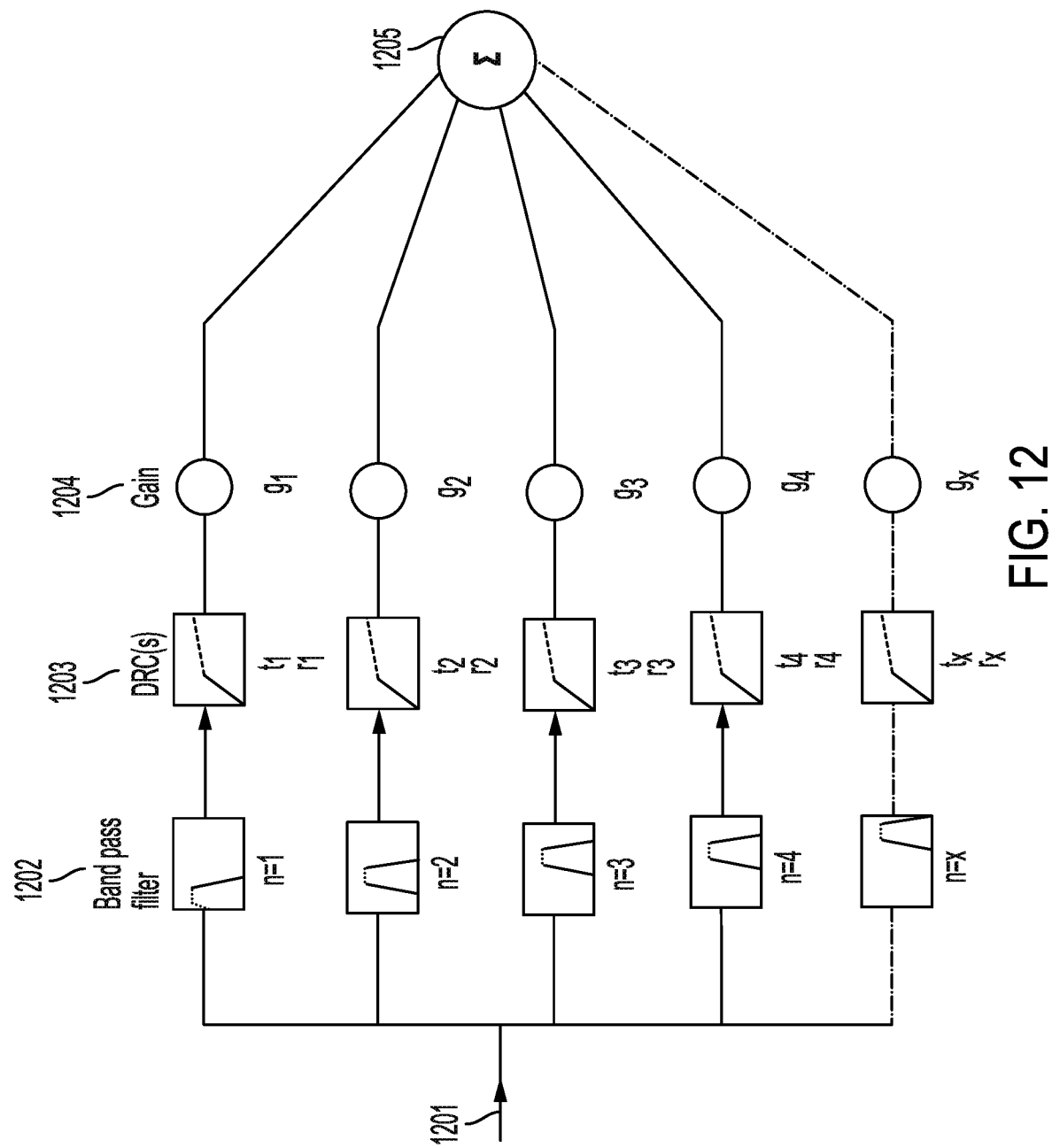
FIG. 12 illustrates an example multiband compressive system according to one or more aspects of the present disclosure.

FIG. 12 illustrates a multi-band compressive DSP system capable of providing the presently disclosed personalization of audio signal processing. An incoming signal 1201 (e.g. audio signal, either raw or pre-processed) is spectrally decomposed into a plurality of sub-band signals by a corresponding plurality of band pass filters 1202. Subsequently, each sub-band signal is transmitted to a dynamic range compressor (DRC) 1203. As illustrated, there is a DRC provided for each sub-band signal, although a greater or lesser number of DRCs 1203 can be provided with respect to the number of sub-band signals as desired, without departing from the scope of the present disclosure. One or more of the DRCs 1203 can be identical, similar, or different, depending on the particular sound personalization that is configured or otherwise desired. In some embodiments, for each sub-band signal, the corresponding one of the DRCs 1203 features a threshold variable $t_x$ (i.e., the threshold value at which DRC compression initiates) and a ratio variable $r_x$ (i.e., the amount of gain reduction provided by the DRC above threshold $t_x$). Subsequently, each sub-band signal may be subject to variable gain $g_x$ 1204 following compression at DRC 1203. For each sub-band signal, the variables may differ according to the receiver's demographic information.

Figure 13:
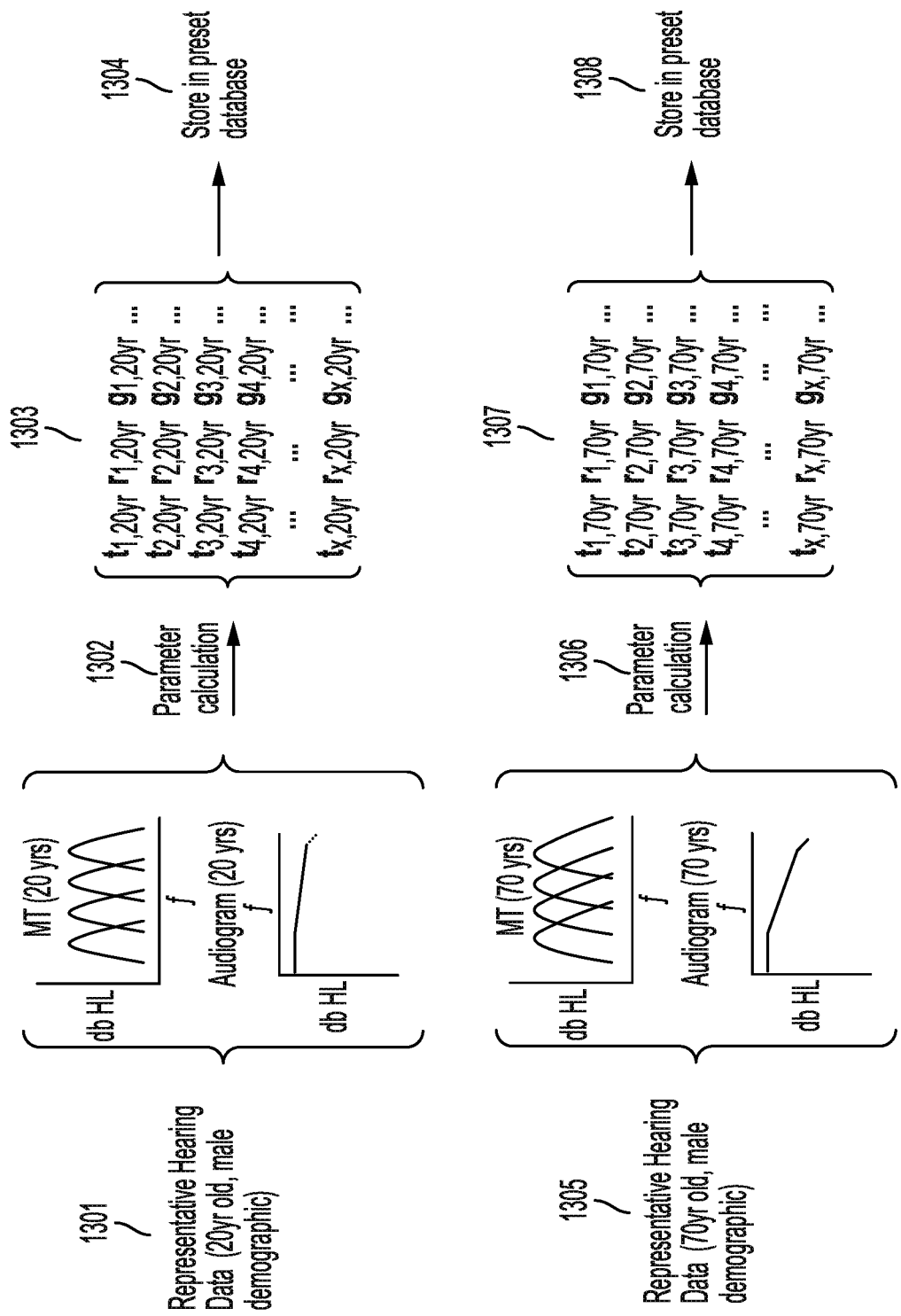
FIG. 13 illustrates how representative hearing data of a demographic group are used to calculate a parameter preset, which is then stored in a database.

FIG. 13 illustrates how a set of parameters may be configured or preset according to an age of an intended user, although it is appreciated that the exemplary parameter preset can also be applied to sex or other demographic information of the intended user. In the particular example of FIG. 13, for an intended user that is 20 years of age and male, hearing data 1301 comprising threshold and suprathreshold information across a range of audible frequencies is used to calculate 1302 a parameter preset 1303. This preset is then stored in a database 1304 according to the particular demographic group. In another example, a preset 1307 is calculated 1306 from the hearing data 1305 of a model 70 year old male and stored in the preset database 1308. Accordingly, these presets 1304, 1308 may then later be retrieved 1303, 1307 from the database 1304, 1308 when a user's demographic information is ascertained 1301, 1305. As illustrated in this example, these parameter presets 1304, 1308 include $t_x$, $r_x$, and $g_x$ values for various values of x, where each individual value is parameterized by age as well, e.g., $\{t_{1,20\ yrs\ age}, r_{1,20\ yrs\ age}, g_{1,20\ yrs\ age}\}$ and $\{t_{1,70\ yrs\ age}, r_{1,70\ yrs\ age}, g_{1,70\ yrs\ age}\}$.

In some embodiments, one or more of the parameters for a given user or a given hearing profile may be interpolated from the nearest relevant age presets, e.g. a 47-year-old hearing preset can be interpolated from existing 45 year old and 50 year old parameter presets. Other configurations of multiband compressive systems are possible without departing from the scope of the present disclosure (see e.g., commonly owned U.S. Pat. No. 10,199,047 and U.S. application Ser. No. 16/244,727), with relevant associated parameters.

The presented technology offers a novel and convenient way to provide added clarity to the TV, video, or multimedia consumption of individuals who may suffer from known or undiagnosed hearing deficiencies by seamlessly personalizing an audio portion of the TV, video, or multimedia content according to the specific hearing profile(s) of the given listening individual(s). It is to be understood that the present disclosure contemplates numerous variations, options, and alternatives. For clarity of explanation, in some instances the present technology may be presented as including individual functional blocks including functional blocks comprising devices, device components, steps or routines in a method embodied in software, or combinations of hardware and software.

Methods according to the above-described examples can be implemented using computer-executable instructions that are stored or otherwise available from computer readable media. Such instructions can comprise, for example, instructions and data which cause or otherwise configure a general-purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example. The instructions, media for conveying such instructions, computing resources for executing them, and other structures for supporting such computing resources are means for providing the functions described in these disclosures.

Although a variety of examples and other information are used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

The invention claimed is:

1. An audio processing method comprising:
  receiving, from one or more users, information suitable to derive an indication of a hearing ability of the one or more users;
  generating a representative indication of hearing ability for the one or more users based on the received information;
  calculating a set of multiband compression (MBC) audio processing parameters for the representative indication of hearing ability, the calculating comprising:
    determining, based on the representative indication of hearing ability, at least a first anchor indication of hearing ability and a second anchor indication of hearing ability;
    obtaining a first set of MBC parameters and a second set of MBC parameters, for the first and second anchor indications of hearing ability respectively; and
    interpolating between the first set of MBC parameters and the second set of MBC parameters, the interpolating based on the representative indication of hearing ability, the first anchor indication of hearing ability, and the second anchor indication of hearing ability;
  configuring a sound personalization multiband compression algorithm based on the interpolated set of MBC audio processing parameters;
  receiving an audio signal on an entertainment system;
  processing the audio signal using the configured sound personalization multiband compression algorithm; and
  outputting the processed audio signal from the entertainment system.

2. The method of claim 1, wherein the information suitable to derive an indication of hearing ability comprises demographic information of the one or more users and the representative indication of hearing ability is determined from the demographic information.

3. The method of claim 2, wherein the demographic information of the one or more users comprises at least one of the sex, the age and the birthdate of the one or more users.

4. The method of claim 1, wherein the information suitable to derive an indication of hearing ability comprises one or more of:
  musical preferences of the one or more users; and
  hearing test results of the one or more users.

5. The method of claim 2, wherein the demographic information is manually inputted by the one or more users.

6. The method of claim 2, wherein the demographic information is retrieved from the one or more user's social media account or from the one or more user's personal account supporting video, photo, music playback, video recording functionality.

7. The method of claim 2, wherein the demographic information of the one or more users is ascertained using a voice recognition algorithm or a facial recognition algorithm.

8. The method of claim 1, wherein configuring the sound personalization multiband compression algorithm based on the interpolated set of MBC audio processing parameters comprises adjusting one or more of a threshold value of a dynamic range compressor provided in each subband of the multiband compression algorithm, a ratio value of a dynamic range compressor provided in each subband of the multiband compression algorithm, and a gain value provided in each subband of the multiband compression algorithm.

9. The method of claim 1, wherein receiving the audio signal comprises receiving the audio signal from a storage device or from a transmitter.

10. The method of claim 1, wherein calculating a set of MBC audio processing parameters for the representative indication of hearing ability comprises deriving the set of MBC audio processing parameters from one or more sets of MBC audio processing parameters for different anchor indications of hearing ability.

11. The method of claim 1, wherein the representative indication of hearing ability is determined based upon the hearing test results of the one or more users, by comparing the hearing test results with representative hearing test results for different indications of hearing abilities and determining a closest match.

12. The method of claim 11, wherein calculating a set of MBC audio processing parameters comprises determining the set of MBC audio processing parameters by optimizing perceptually relevant information for the one or more users based on the hearing test results.

13. The method of claim 1, wherein the information suitable to derive an indication of hearing ability is received at a server where the representative indication of hearing ability and the set of audio processing parameters are determined.

14. The method of claim 13, further comprising transmitting the set of interpolated MBC audio processing parameters from the server to the entertainment system.

15. The method of claim 1, wherein the entertainment system comprises a control unit and headphones, such that the audio signal is processed on the control unit or the headphones and outputted from the headphones.

16. The method of claim 1, wherein information suitable to derive an indication of hearing ability for a plurality of users is received and the representative indication of hearing ability for the plurality of users is determined by selecting the youngest indication of hearing ability of the users.

17. An audio processing system comprising:
at least one processor; and
at least one memory storing instructions, which when executed cause the at least one processor to perform actions comprising:
  receiving, from one or more users, information suitable to derive an indication of a hearing ability of the one or more users;
  generating a representative indication of hearing ability for the one or more users based on the received information;
    determining calculating a set of audio processing parameters for the representative indication of hearing ability, the calculating comprising:
    determining, based on the representative indication of hearing ability, at least a first anchor indication of hearing ability and a second anchor indication of hearing ability;
    obtaining a first set of audio processing parameters and a second set of audio processing parameters, for the first and second anchor indications of hearing ability respectively; and
    interpolating between the first set of audio processing parameters and the second set of audio processing parameters, the interpolating based on the representative indication of hearing ability, the first anchor indication of hearing ability, and the second anchor indication of hearing ability;
  configuring a sound personalization multiband compression algorithm based on the interpolated set of audio processing parameters;
  receiving an audio signal on an entertainment system;
  processing the audio signal using the configured sound personalization multiband compression algorithm; and
  outputting the processed audio signal from the entertainment system.

18. A non-transitory computer-readable storage medium storing a program containing instructions which, when executed on a processor of an audio output device cause the processor to perform actions comprising:
  receiving, from one or more users, information suitable to derive an indication of a hearing ability of the one or more users;
  generating a representative indication of hearing ability for the one or more users based on the received information;
  calculating a set of audio processing parameters for the representative indication of hearing ability, the calculating comprising:
    determining, based on the representative indication of hearing ability, at least a first anchor indication of hearing ability and a second anchor indication of hearing ability;
    obtaining a first set of audio processing parameters and a second set of audio processing parameters, for the first and second anchor indications of hearing ability respectively; and
    interpolating between the first set of audio processing parameters and the second set of audio processing parameters, the interpolating based on the representative indication of hearing ability, the first anchor indication of hearing ability, and the second anchor indication of hearing ability;
  configuring a sound personalization multiband compression algorithm based on the interpolated set of audio processing parameters;
  receiving an audio signal on an entertainment system;
  processing the audio signal using the configured sound personalization multiband compression algorithm; and
  outputting the processed audio signal from the entertainment system.

* * * * *